United States Patent
Cario et al.

(10) Patent No.: US 10,867,237 B2
(45) Date of Patent: Dec. 15, 2020

(54) SINGLE-COMPONENT ARTIFICIAL NEURON BASED ON MOTT INSULATORS, NETWORK OF ARTIFICIAL NEURONS AND CORRESPONDING MANUFACTURING METHOD

(71) Applicants: Centre National de la Recherche Scientifique—CNRS, Paris (FR); Universite de Nantes, Nantes (FR); Universite Paris-Sud XI, Orsay (FR)

(72) Inventors: Laurent Cario, Nantes (FR); Benoit Corraze, Carquefou (FR); Pablo Stoliar, Ibaraki (JP); Julien Tranchant, Reze (FR); Etienne Janod, La Chapelle sur Erdre (FR); Marie-Paule Besland, Orvault (FR); Marcelo Rozenberg, Paris (FR)

(73) Assignees: CENTRE NATIONAL DE LA RECHERCHE SCIENTIFIQUE—CNRS, Paris (FR); UNIVERSITE DE NANTES, Nantes (FR); UNIVERSITE PARIS-SUD XI, Orsay (FR)

( * ) Notice: Subject to any disclaimer, the term of this patent is extended or adjusted under 35 U.S.C. 154(b) by 892 days.

(21) Appl. No.: 15/307,269

(22) PCT Filed: Apr. 24, 2015

(86) PCT No.: PCT/EP2015/058873
§ 371 (c)(1),
(2) Date: Oct. 27, 2016

(87) PCT Pub. No.: WO2015/165809
PCT Pub. Date: Nov. 5, 2015

(65) Prior Publication Data
US 2017/0124449 A1 May 4, 2017

(30) Foreign Application Priority Data

Apr. 28, 2014 (FR) .................................... 14 53834

(51) Int. Cl.
*H01L 45/00* (2006.01)
*G06N 3/063* (2006.01)
(Continued)

(52) U.S. Cl.
CPC ............. *G06N 3/063* (2013.01); *G06N 3/049* (2013.01); *G06N 3/0635* (2013.01); *G11C 11/54* (2013.01);
(Continued)

(58) Field of Classification Search
None
See application file for complete search history.

(56) References Cited

U.S. PATENT DOCUMENTS

| 6,570,224 B1 | 5/2003 | Ilyanok | |
| 2007/0015328 A1* | 1/2007 | Hsu | H01L 27/2463 438/250 |

(Continued)

FOREIGN PATENT DOCUMENTS

| CN | 1338120 A | 2/2002 |
| CN | 101364594 A | 2/2009 |

OTHER PUBLICATIONS

Pickett et al (A Scalable neuristor Built with Mott Menneoresistors, Nature Materials, vol. 12 Feb. 2013, pp. 114-117).*
(Continued)

*Primary Examiner* — Ali Naraghi
(74) *Attorney, Agent, or Firm* — David D. Brush; Westman, Champlin & Koehler, P.A.

(57) ABSTRACT

An artificial neuron includes a single-component electric dipole including a single material which belongs to the class
(Continued)

of Mott insulators and is connected to first and second electric electrodes.

11 Claims, 8 Drawing Sheets

(51) Int. Cl.
  *G11C 11/54* (2006.01)
  *G11C 13/00* (2006.01)
  *G06N 3/04* (2006.01)
(52) U.S. Cl.
  CPC ...... *G11C 13/0002* (2013.01); *H01L 45/1253* (2013.01); *H01L 45/14* (2013.01); *H01L 45/16* (2013.01)

(56) References Cited

U.S. PATENT DOCUMENTS

| | | | |
|---|---|---|---|
| 2014/0035614 A1 | 2/2014 | Pickett | |
| 2014/0214738 A1* | 7/2014 | Pickett | G06N 3/0635 706/27 |
| 2015/0255714 A1* | 9/2015 | Cario | H01L 45/143 257/4 |
| 2015/0379395 A1 | 12/2015 | Pickett | |

OTHER PUBLICATIONS

Rozenberg (Universal dielectric breakdown and synaptic behavior in Mott insulators).*

English translation of the relevant parts (pp. 180-181) of A. Crunteanu-Stanescu, "Chapiture 3 Conculusions et Perspectives", Conception et Developpement de Dispositifs et materiaux innocants pour la microelectronique et l'optique, Apr. 4, 2014 (Apr. 4, 2014), pp. 174-184, XP055161101.

First Office Action of the State Intellectual Property Office of China dated Jun. 29, 2018 for Chinese Patent Application No. 201580023093.2, filed on Apr. 24, 2015.

International Preliminary Report on Patentability and English translation of the Written Opinion dated Nov. 1, 2016, for corresponding International Application No. PCT/EP2015/058873, filed Apr. 24, 2015.

International Search Report dated Oct. 28, 2015 for corresponding International Application No. PCT/EP2015/058873, filed Apr. 24, 2015.

M. J. Rozenberg: "Universal Dielectric Breakdown and Synaptic Behavior in Mott Insulators", Abstracts of the Conference on Ultrafast Dynamics of Correlated Materials, Oct. 14, 2013 (Oct. 14, 2013), XP055160890.

M.D. Pickett et al., "A Scalable Neuristor Built with Mott Memristors", Nature Materials, vol. 12, No. 2, Dec. 16, 2012 (Dec. 16, 2012), pp. 114-117, XP055110620.

Technology Working Group on Emerging Research Devices, "Emerging Research Devices", 2013 Edition of the International Technology Roadmap for Semiconductors, 2013, XP055160881.

A. L. Pergament et al., "Oxide Electronics and Vanadium Dioxide Perspective: A Review", Journal on Selected Topics in Nano Electronics and Computing, vol. 1, No. 1, Dec. 15, 2013 (Dec. 15, 2013), pp. 24-43, KP055161096.

A. Crunteanu-Stanescu, "Chapiture 3 Conculusions et Perspectives", Conception et Developpement de Dispositifs et materiaux innocants pour la microelectronique et l'optique, Apr. 4, 2014 (Apr. 4, 2014), pp. 174-184, XP055161101.

Written Opinion dated Oct. 28, 2015 for corresponding International Application No. PCT/EP2015/058873, filed Apr. 24, 2015.

* cited by examiner

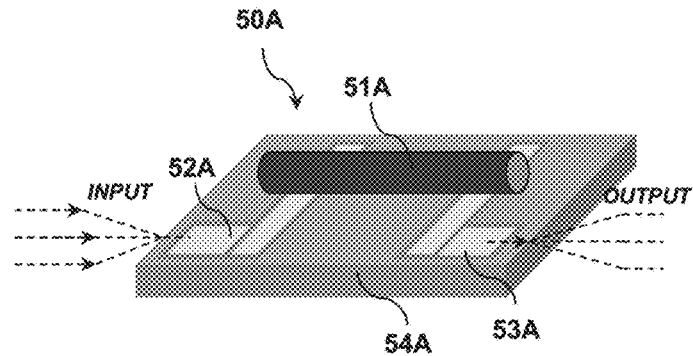
Figure 5A
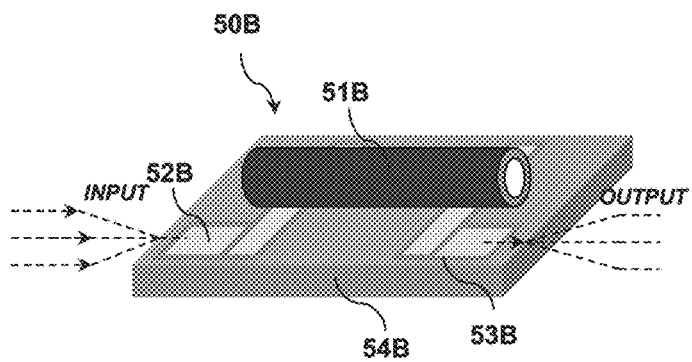
Figure 5B
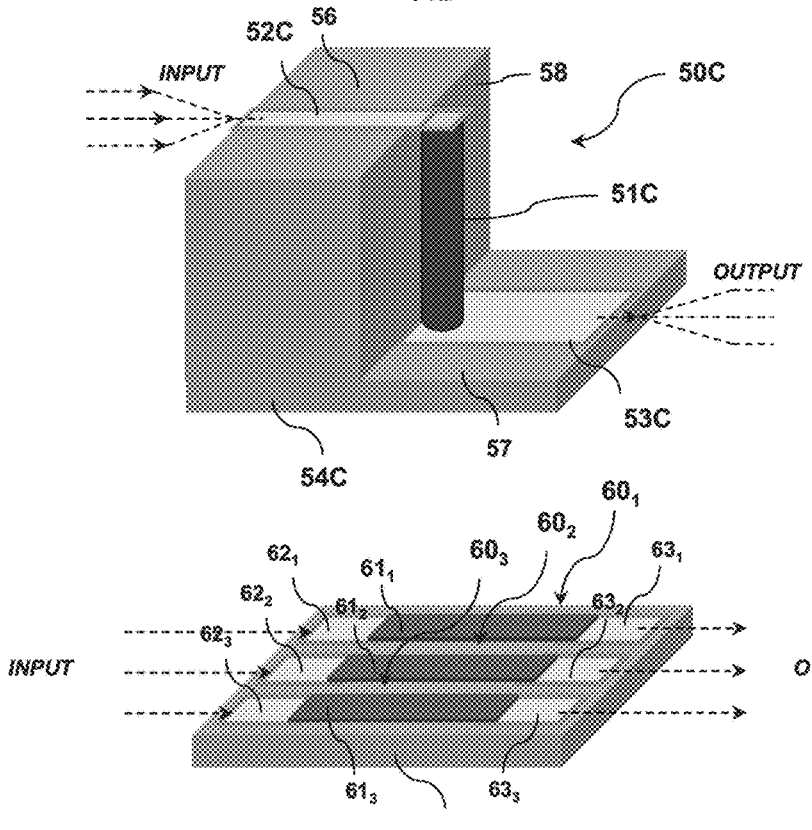
Figure 5C
Figure 6

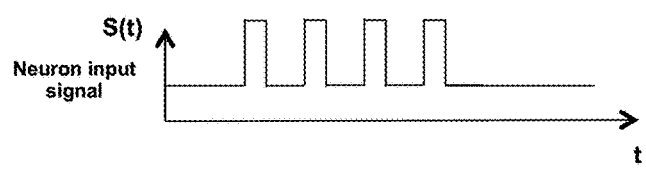
Figure 7A
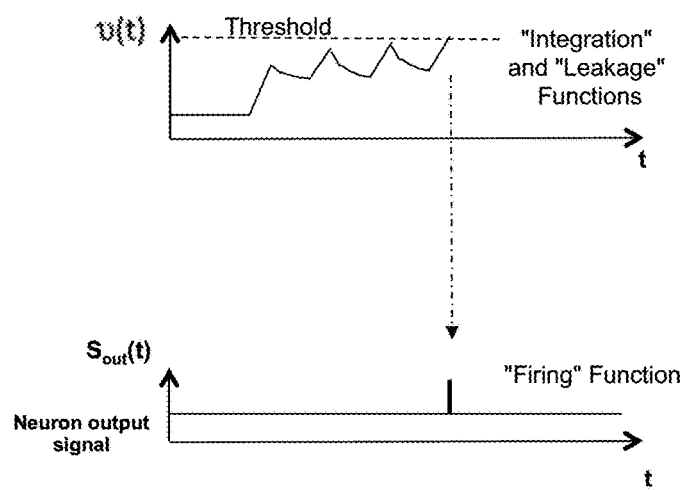
Figure 7B
Figure 7C

SINGLE-COMPONENT ARTIFICIAL NEURON BASED ON MOTT INSULATORS, NETWORK OF ARTIFICIAL NEURONS AND CORRESPONDING MANUFACTURING METHOD

CROSS-REFERENCE TO RELATED APPLICATIONS

This Application is a Section 371 National Stage Application of International Application No. PCT/EP2015/058873, filed Apr. 24, 2015, which is incorporated by reference in its entirety and published as WO 2015/165809 on Nov. 5, 2015, not in English.

FIELD OF THE INVENTION

The field of the invention is that of neuromorphic electronic circuits and more particularly that of artificial neurons.

Networks of artificial neurons draw inspiration from networks of biological neurons, the functioning of which they mimic.

More specifically, the invention relates to a novel design of an artificial neuron.

The invention can be applied especially but not exclusively in the field of artificial intelligence, and more particularly in the field of associative memories, image and sound recognition methods or again in the field of learning or self-learning methods implemented by networks of artificial neural networks. For example, these learning methods enable the extraction of knowledge organized on the basis of real or simulated data according to the following principle: data considered to be similar are grouped together in a same group while data considered to be different are distributed among separate groups.

TECHNOLOGICAL BACKGROUND

For the past half century, the revolution in information technologies has been closely associated with the development of the computer. Now, all computers are built according to an architecture known as the Von Neumann architecture. This architecture, according to which the central processing unit (CPU) and the memories constitute separate blocks is extremely efficient for certain tasks such as ultra-fast processing of bulky data streams.

However, this architecture is inefficient in many contexts and, in many major classes of problems, computers are still outclassed by the human brain which works according to a highly different architecture based on an intermingled network of neurons and biological synapses.

One promising avenue that can make it possible to go beyond these limitations inherent to the Von Neumann architecture therefore lies in the development of a neuromorphic type of electronic architecture constituted by neurons and artificial synapses imitating the architecture of the human brain. Essentially, the human brain consists of a network of $10^{11}$ neurons connected together by $10^{15}$ synapses. The data are stored in the memory of the human brain at the different levels of conductance of the synapses, commonly called synaptic weights. The making of an artificial brain therefore requires the making of artificial neural networks that imitate the interconnection of the neurons via the synapses.

The networks of artificial neurons are essentially formed by neurons connected to one another by synapses. FIG. 1 for example presents a neuromorphic architecture, called a multi-layer perceptron architecture, formed by six neurons (referenced 10) and eighteen synapses (referenced 20). The synaptic weight is represented by the letter w.

While micro-electronics based on the Von Neumann architecture has reached its physical limits as regards to the miniaturization of electronic components, these neuromorphic architectures are arousing very great hope among research workers and industrialists, especially as regards energy efficiency.

There are different types of networks of artificial neurons known in the prior art.

In most cases, these neural networks are "virtual", i.e. they are implemented by computer programs knows as software neural networks using computers with conventional architecture, which reduces their efficiency, especially in terms of energy consumption.

Recently, hardware neuromorphic architectures based on hardware neural networks have appeared as promising alternative solutions, in which each neuron and each synapse is constituted by classic electronic components. Now, at present, making these artificial neurons and artificial synapses requires the use of relatively complex and energy-hungry electronic circuits.

For example, the classic implementation of an artificial synapse requires the use of a large number of components, including more than ten transistors. Recently, the discovery of memristors (namely dipoles for which the electrical resistance depends on the chronology of the electrical signal that passes through them) has brought about a major conceptual leap in the field of artificial synapses.

In comparison, far less progress has been achieved in the field of artificial neurons. One exemplary embodiment of a multi-component artificial neuron 10 according to the prior art is illustrated in FIG. 2. This neuron 10 requires the implanting, on a printed circuit, of a large number of electronic components such as transistors (for example using CMOS technology), amplifiers and capacitors, components laid out according to a relatively complex architecture. The layout of the different components is a relatively complex operation: a large number of components have to be placed on an ever smaller surface area because of the requirements of miniaturization. In addition, despite the reduction of the size of the electronic components, the entire unit still occupies a certain amount of surface area which it is difficult to reduce. In addition, such complexity greatly hampers the overall performance of the electronic circuit in terms of integration and energy efficiency.

This complexity can be explained by the fact that an artificial neuron must fulfill many functions. First of all, an artificial spiking neuron must react to the application of sequences of electrical pulses. Indeed, it is in this form of pulses ("spikes") that the information circulates in the most promising artificial neural networks.

In addition, an artificial neuron must ideally reproduce behavior similar to that described by the LIF ("Leaky Integrate-and-Fire") standard model, i.e. behavior that implements the following three functions: integration, leakage and firing.

The principle of the LIF model is based on a simplified description of a biological neuron centered on the electrical charge accumulated through the pre-synaptic membrane. It models this membrane by means of a capacitor C and a leaky resistor R connected in parallel. When an artificial neuron receives an input electrical signal S(t), the LIF model stipulates that:

(i) the artificial neuron temporally integrates a function of this input signal;
(ii) the quantity corresponding to the result of this integration by the artificial neuron relaxes (becomes leaky) over time. The electrical signal v(t), which results from the two phenomena of integration and leakage is equivalent to the pre-synaptic membrane potential for a biological neuron.
(iii) the artificial neuron triggers an output signal (fire) when the electrical signal v(t) reaches a given threshold.

This model can be mathematically summarized by the following equation:

$$\frac{\partial}{\partial t}v(t) = -v(t)\frac{1}{RC} + \frac{w}{C}S(t) \quad \text{equation (1)}$$

where:
v(t) represents the electrical signal after integration by the artificial neuron;
RC represents the characteristic time of exponential relaxation of the integrated signal;
w represents the synaptic weight;
S(t) is a function representing information (i.e. the electrical pulses) reaching the input of the artificial neuron weighted by the synaptic weight w;

The LIF model postulates the existence of a single threshold for v(t), independent of the shape of the input signal, beyond which the artificial neuron LIF triggers the "firing" function. Should the input electrical signal S(t) be a sequence of square-wave electrical pulses of same amplitude, the mathematical development of the LIF model is used to establish the following theoretical relationship:

$$N_{Fire} = -\frac{\tau}{t_{off}}\ln\left\{1 - \frac{\tau}{t_{on}} \times \left[1 - \exp\left(\frac{-t_{off}}{\tau}\right)\right] \times \left[1 - \exp\left(\frac{-t_{Fire}}{\tau}\right)\right]\right\} \quad \text{equation (2)}$$

where $N_{Fire}$ represents the number of electrical pulses need to trigger the "firing" function; $t_{on}$ is the duration of application of each electrical pulse; $t_{off}$ is the duration that elapses between two successive electrical pulses (see FIG. 9); $t_{Fire}$ is the time needed to trigger the "firing" function should the input electrical signal be constituted by a single constant pulse with a duration greater than $t_{Fire}$ (see FIG. 10) et t=RC, the characteristic time of the relaxation (see equation (1)).

In the prior art, there is the known US patent application 2014/0035614 (Matthew D. Pickett) which proposes an implementation of a "Hodgkin-Huxley" type artificial neuron using an electronic circuit designated as a "neuristor". Now such a circuit uses a certain number of electronic components such as resistors, capacitors and memristors, and is therefore built in the same spirit as conventional artificial neurons based on CMOS transistors discussed above. This type of neuron is therefore complex to implement and its performance in terms of integration is limited. In addition, the focus of this type of neuron is on the generation of an action potential and does not implement the three main functions of the LIF model, namely leaking, integration and firing.

In this context, it would be particularly worthwhile to simplify the making of artificial neurons and artificial neural networks.

GOAL OF THE INVENTION

The invention in at least one embodiment is aimed especially at overcoming these different drawbacks of the prior art.

More specifically, it is the goal of at least one embodiment of the invention to propose an artificial neuron of a novel design that is simple to make. At least one embodiment of the invention is also aimed at proposing an artificial neuron that offers high potential of integration into electronic circuits.

SUMMARY OF THE INVENTION

One particular embodiment of the invention proposes an artificial neuron constituted by a single-component electrical dipole comprising a sole material belonging to the family of Mott insulators connected to two electrical electrodes.

Thus, the invention proposes an artificial neuron of novel design constituted by a single single-component electrical dipole. The term "electrical dipole" is understood to mean an electronic component having two terminals.

In the context of experiments carried out on Mott insulators displaying the phenomenon of volatile resistive transition induced by electrical pulses, the inventors have discovered a novel property of this family of materials which makes it possible to implement an artificial neuron in a far more simple way than in the prior art. Indeed, unlike in the prior-art artificial neurons which require the implementation of complex electronic circuits, the single-component artificial neuron according to the invention is constituted by a single electrical dipole, itself constituted by an insulating MOTT material included between two electrical electrodes. When this dipole is subjected to a sequence of electrical spikes (representing information coming from the synapses), it fulfills three elementary functions of an artificial neuron as described in the LIF reference model, namely integration with leaking and firing.

This solution implements only one elementary component fulfilling all the functions of an artificial neuron and is all the more surprising as, for those skilled in the art, the prior art solutions propose complex circuits based on various electronic components. The solutions proposed by the prior art would therefore divert those skilled in the art away from the approach leading to the invention which runs counter to what has been previously established.

Besides, because it implements only one electrical dipole, the single-component artificial neuron according to the invention requires little energy and has high potential of integration into electronic circuits.

According to one particular aspect of the invention, the artificial neuron comprises an input and an output. The artificial neuron is such that a first extremity of the electrical dipole comprises a first electrical electrode which constitutes said input and a second extremity of the electrical dipole comprises a second electrical electrode which constitutes said output of the artificial neuron.

According to one particular aspect of the invention, the first and second electrical electrodes are constituted by an electrically conductive material belonging to the group comprising:
  at least one of the following elements: platinum (Pt), gold (Au), molybdenum (Mo), graphite (C), aluminum (Al), copper (Cu), doped silicon (Si);
  at least one of the following alloys: brass (Cu—Zn), steel (Fe—C), bronze (Cu—Sn);

at least one of the following transition metal compounds: TiN, TaN, $RuO_2$, $SrRuO_3$, $CuS_2$).

It must be noted that this list is not exhaustive.

According to one particular aspect of the invention, said material belongs to the group comprising:
compounds with the formula $AM_4Q_8$, with A comprising at least one of the following elements: Ga, Ge, Zn; M comprising at least one of the following elements: V, Nb, Ta, Mo and Q which comprises at least one of the following elements: S, Se, Te;
compounds with the formula $(V_{1-x}M_x)_2O_3$, with $0 \leq x \leq 1$, M comprising at least one of the following elements: Ti, Cr, Fe, Al, or Ga;
compounds with the formula $NiS_{2-x}Se_x$, with $0 \leq x \leq 1$;
the compound with the formula $VO_2$;
organic Mott insulator compounds.

It must be noted that this list is not exhaustive.

According to one particularly advantageous characteristic of the invention, said material takes the form of:
a block of crystal based on a Mott insulator; or
at least one thin layer based on a Mott insulator; or
a nanotube based on a Mott insulator; or
a nanowire based on a Mott insulator.

Thus, the structure of the artificial neuron can take several particular embodiments.

Thus, in the first case (where the material takes the form of a block of crystal), the structure of the artificial neuron can be equated with a three-dimensional structure.

Thus, in the second case (where the material takes the form of a thin layer), the structure of the artificial neuron can be equated with a two-dimensional structure.

Thus, in the third and fourth cases (where the material takes the form of a nanotube or a nanowire), the structure of the artificial neuron can be equated with a one-dimensional structure.

Another embodiment of the invention proposes a network of neurons comprising a plurality of artificial neurons interconnected by artificial synapses, said network being such that at least one artificial neuron complies with the above-mentioned device (in any one of its different embodiments).

The invention drastically simplifies the making of artificial neural networks. In one particular embodiment, it is possible to envisage a network of artificial neurons, some of which are neurons according to the invention while others are neurons of the prior art. In another embodiment, which in this case is a preferred embodiment, each artificial neuron of the network is a single-component artificial neuron according to the invention.

Another embodiment of the invention proposes a neuromorphic electronic circuit comprising a plurality of artificial neurons interconnected to one another by artificial synapses or a set of electronic components, the circuit being such that at least one artificial neuron complies with the above-mentioned device (in any one of its different embodiments.)

Another embodiment of the invention proposes a method for manufacturing an artificial neuron comprising the following steps:
obtaining a material belonging to the family of Mott insulators;
depositing a layer of conductive material:
at a first extremity of said Mott insulator material to form a first electrical electrode,
at a second extremity of said Mott insulator material to form a second electrical electrode.

The single-component artificial neuron obtained according to the invention therefore has great simplicity of manufacture. It must be noted that the step for depositing electrical electrodes can be achieved either before or after the Mott insulator has been deposited.

According to one particular embodiment, said step for obtaining a material comprises a step for cutting out a block of crystal belonging to the family of Mott insulators, and said step for depositing a layer of conductive material is performed as a function of said block of cut-out crystal.

According to one alternative embodiment, said step for obtaining a material comprises a step for the depositing, on a substrate wafer, of a thin layer based on a material belonging to the family of Mott insulators, said step for depositing a layer of conductive material at the first and second extremities being performed as a function of said deposited thin layer.

According to another alternative embodiment, said step for obtaining a material comprises a step for the depositing, on a substrate wafer, of a nanotube or a nanowire based on a material belonging to the family of Mott insulators, said step for depositing a layer of conductive material at the first and second extremities being performed as a function of said deposited nanotube or nanowire.

LIST OF FIGURES

Other features and advantages of the invention shall appear from the following description, given by way of an indicative and non-exhaustive example, and from the appended drawings, of which:

FIG. 1, already described with reference to the prior art, presents an example of a neuromorphic architecture consisting of artificial neurons (illustrated by circles) connected on one another by artificial synapses (illustrated by rectangles);

FIG. 2, already described with reference to the prior art, presents an electronic diagram of an artificial neuron of the prior art;

FIG. 3 presents a structure of a single-component artificial neuron according to a first particular embodiment of the invention (3D neuron);

FIGS. 4A, 4B each present an example of a structure of a single-component artificial neuron according to a second particular embodiment of the invention (2D neuron);

FIGS. 5A, 5B, 5C each present an example of a structure of a single-component artificial neuron according to a third particular embodiment of the invention (1D neuron);

FIG. 6 presents a structure of a network of three single-component artificial neurons according to one particular embodiment of the invention;

FIGS. 7A, 7B, 7C are timing diagrams presenting the evolution of electrical signals illustrating the principle of operation of an artificial neuron of the leaky integrate-and-fire (LIF) type;

Figure 8:
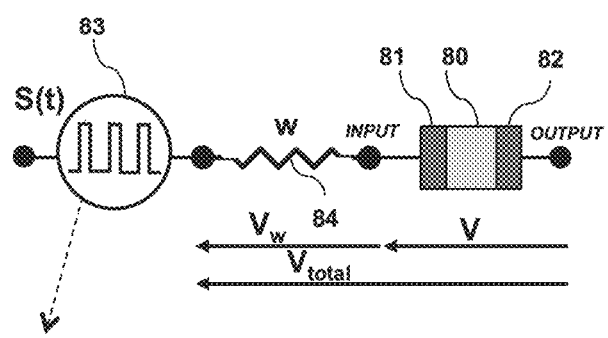
FIG. 8 represents an experimental assembly diagram used to apply electrical pulses and reveal the Leaky Integrate-and-Fire (LIF) behavior of the single-component artificial neuron according to the invention.
Figure 11:
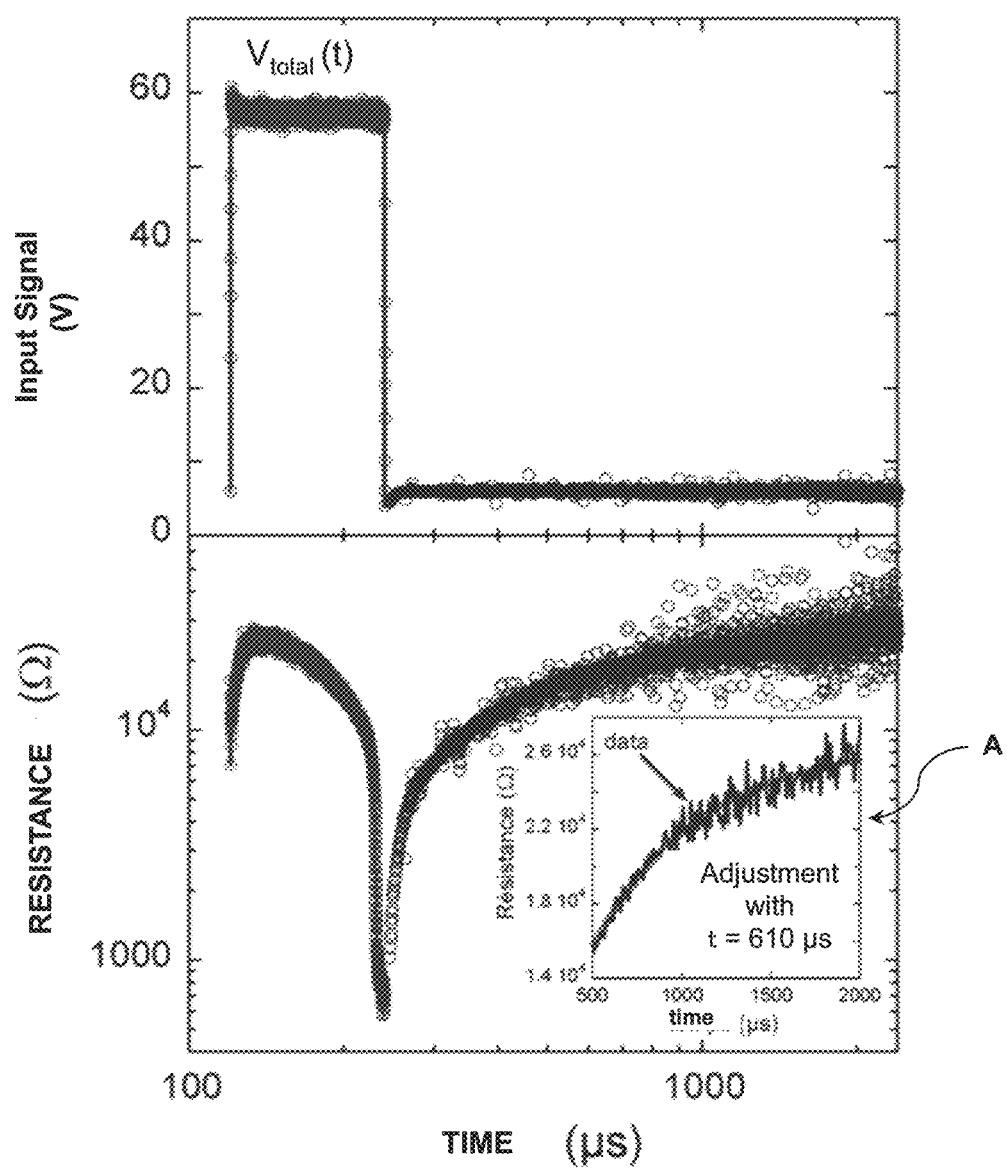
Figure 12A:
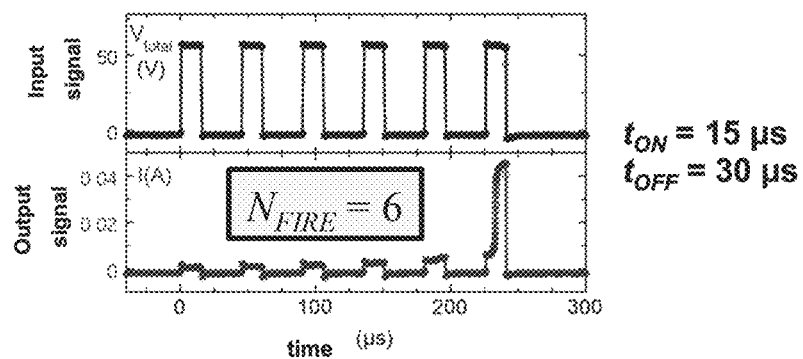
Figure 12B:
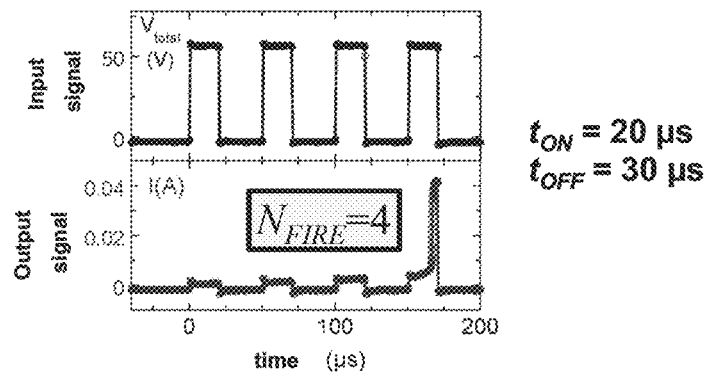
Figure 12C:
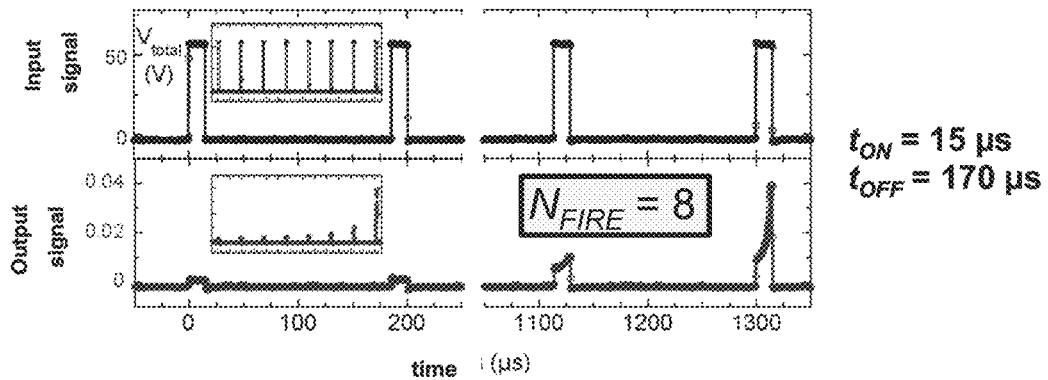
Figure 13A:
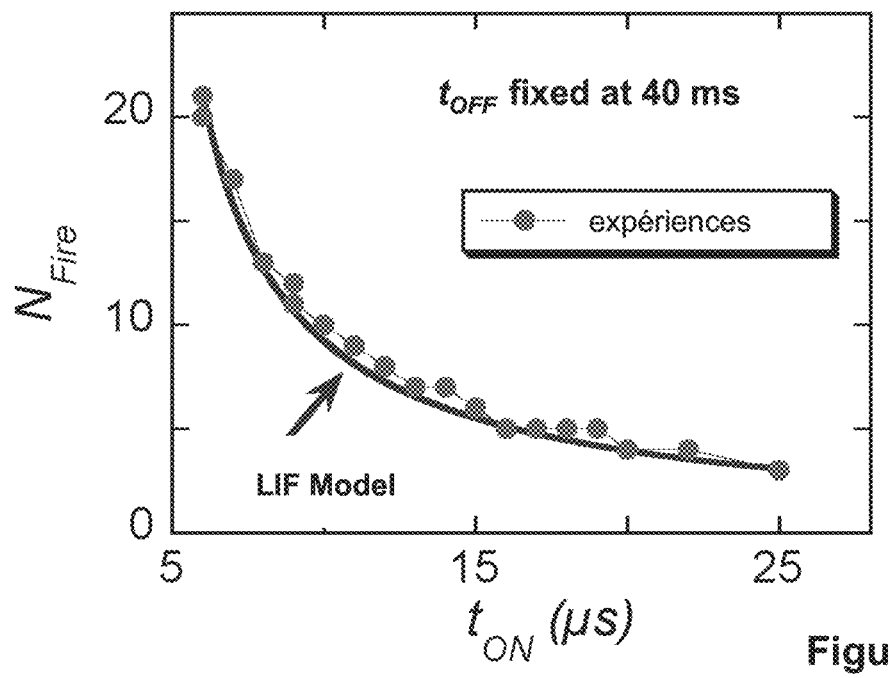
Figure 13B:
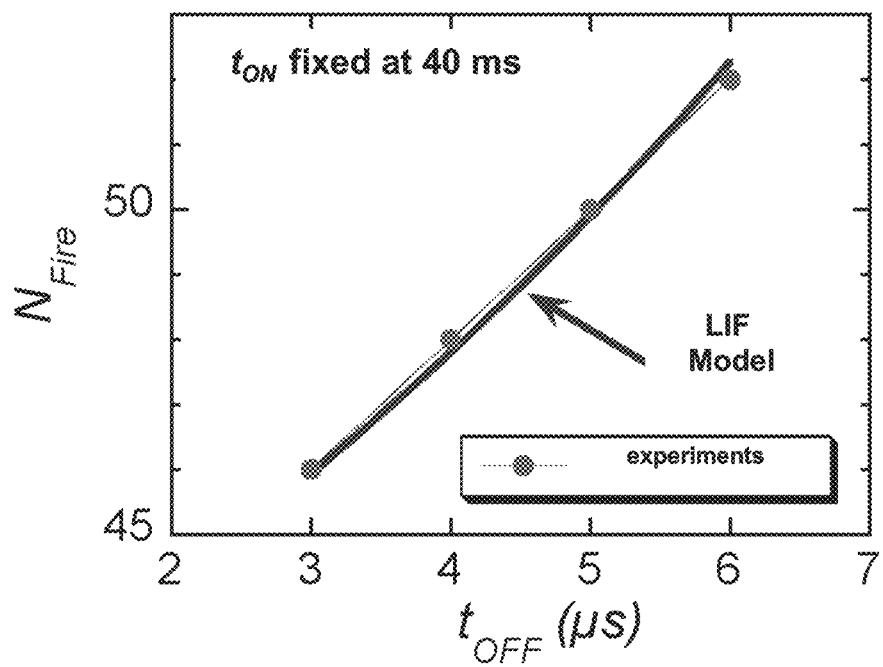

FIG. 11 presents two experimental curves used on the one hand to reveal the volatile character of the resistive transition and, on the other hand, to determine the relaxation time associated with the phenomenon of leakage of the single-component artificial neuron according to the invention;

FIGS. 12A, 12B, 12C present a set of experimental curves obtained for the experimental device described in FIG. 8, illustrating the leaky integrate-and-fire (LIF) functions of the single-component artificial neuron according to the invention;

FIGS. 13A, 13B present the correspondence between the experimental data obtained for the experimental device described in FIG. 8 and the theory of the LIF model.

DETAILED DESCRIPTION

In all the figures of the present document, the identical elements are designated by a same numerical reference.

The invention proposes a single-component artificial neuron of a novel design compliant with the LIF (Leaky Integrate-and-Fire) reference model.

Figure 3:
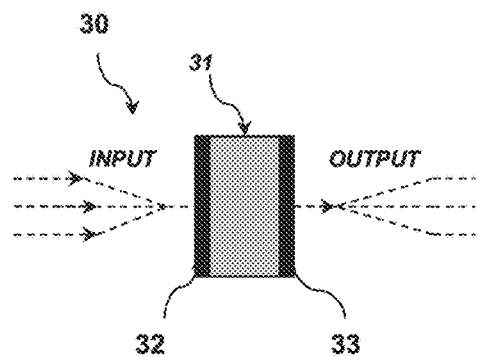

FIG. 3 presents an example of a structure of a single-component artificial neuron 30 according to a first particular embodiment of the invention (three-dimensional structure).

The single-component artificial neuron 30 shown in this figure consists of a single electrical dipole comprising a piece of crystal 31 of a material belonging to the family of Mott insulators, for example a compound with the formula $GaTa_4Se_8$, connected by two electrodes 32 and 33. The two electrodes 32 and 33 are each constituted by an electrically conductive material.

As described in greater detail below with reference to FIGS. 8 to 13, the single-component artificial neuron 30 thus obtained according to the invention is of the leaky integrate-and-fire type, i.e. it fulfills the three functions of the artificial neuron according to the LIF reference model.

In this example, the Mott insulating material 31 is a block of cut crystal 20 µm thick, 300 µm long and 200 µm wide. Each electrical electrode typically takes the form of a thin layer 0.1 µm thick, 300 µm long and 200 µm wide. It must be noted that these dimensions are given purely by way of an illustration and can of course be different.

In this particular embodiment, since the crystal block 31 is a 3D structure, the neuron 30 according to the invention is equated with a 3D artificial neuron.

In general, the dimensions of the piece of Mott insulator crystal 31, the electrical electrodes 32, 33 and their layout relative to said piece of crystal as well as the choice of the materials can be optimized so that the single-component artificial neuron 30 thus obtained can enjoy the best performance (in terms of quality of response of the electrical dipole relative to the performance expected in the LIF model of the artificial neuron, structural integration, etc.).

Below, a description is given of the main steps of the method for manufacturing the single-component artificial neuron 30 represented in FIG. 3.

First of all a piece of crystal made of $GaTa_4Se_8$ is cut out. This piece of crystal made of $GaTa_4Se_8$ constitutes the functional material of the single-component artificial neuron 30. Then, a conductive material constituting the input electrode 32 (denoted as INPUT in the figure) and the output electrode 33 (denoted as OUTPUT in the figure) of the artificial neuron is deposited on the opposite faces of the piece of crystal 31.

This deposition can be done typically either by direct application to the faces of the crystal of a conductive lacquer or by using a deposition technique such as for example Joule effect evaporation or magnetron sputtering (PVD or physical vapor deposition).

Figure 4A:
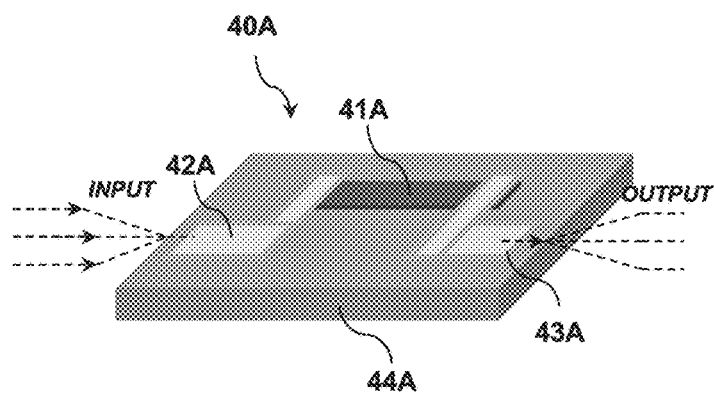
Figure 4B:
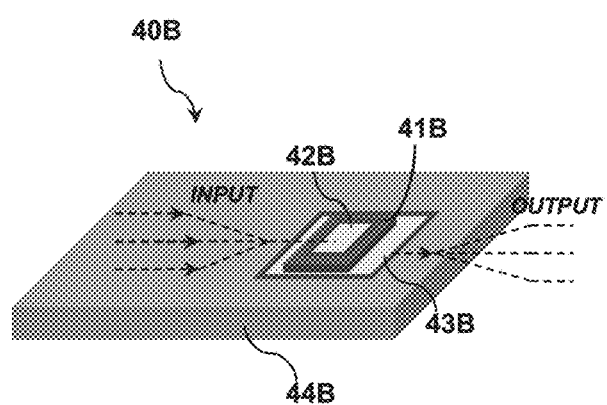

FIGS. 4A and 4B present two examples of the structure of a single-component artificial neuron 30 according to a second particular embodiment of the invention (two-dimensional structure).

The single-component artificial neuron 40A represented in FIG. 4A is constituted by a single electrical dipole comprising a layer of material 41A belonging to the family of Mott insulators, for example the compound with the formula $GaV_4S_8$, connected by two electrically conductive electrodes 42A and 43A.

The electrical dipole is supported by an insulator substrate 44A. It is therefore the electrical dipole 40A, as a single elementary electronic component, that behaves like an artificial neuron, and the insulator substrate 44A plays only the role of a support of the device of the invention. As described in greater detail below, with reference to FIGS. 8 to 13, the single-component artificial neuron 40A thus obtained according to the invention is of the leaky integrate-and-fire type, i.e. it fulfills the three functions of the artificial neuron compliant with the reference model LIF.

In the exemplary embodiment illustrated here, the first electrode 42A has the shape of an L and is disposed partly on a first extremity of the Mott insulator layer 41A, the other part extending on the insulator substrate 44A. This electrode forms the input of the single-component artificial neuron 40A (denoted as INPUT in the figure). The second electrode 43A has the shape of an L and is disposed partly on the second extremity of the layer of Mott insulator 41A, the other part extending on the insulator substrate 44A. This electrode forms the output of the single-component artificial neuron 40A (denoted as OUTPUT in the figure).

It can be observed here that the set of electrodes 42A, 43A is disposed on the layer of Mott insulator 41A, in other words, it is placed there once the layer of Mott insulator 41A has been deposited on the substrate 44A. This is of course an example of one particular structure. It is clear that many other single-component artificial neuron structures can be envisaged without departing from the framework of the invention. It is possible especially to plan for example for a neuron structure according to which the electrodes are laid out on the layer of Mott insulator 41A (as is the case in the particular embodiment illustrated in FIG. 6). It is also possible for example to plan for the layer of Mott insulator to be sandwiched between the electrodes, as shown in FIG. 4B. Similarly, the shape and the dimensions of the electrodes can also vary according to the desired neuromorphic architecture.

The single-component artificial neuron 40B represented in FIG. 4B is constituted by a sole electrical dipole comprising a layer of material 41B, with the formula $GaV_4S_8$, sandwiched between the electrodes 42A and 43A. This entire unit is disposed on a substrate wafer 44B.

In these two examples, the layer of Mott insulator material is a thin layer 0.1 µm thick, 20 µm long and 1 µm wide. Each electrode has a thickness of 0.1 µm.

Here below in this document, the term "thin layer" is understood to mean a layer of material, the thickness of which is generally smaller than 10 µm, as opposed to "thick layers", the thickness of which is generally greater than 10 µm.

It must be noted that these dimensions are given purely by way of an illustration and can of course be different.

In this particular embodiment, the thin layer of Mott insulator material is deemed to have a two-dimensional (2D) structure. The neuron 40A or 40B according to the invention can therefore be equated with a two-dimensional (2D) artificial neuron.

In general, the dimensions of the Mott insulator layer, the metal electrodes and their layout relative to said layer as well as the choice of the materials can be optimized so that the single-component artificial neuron thus obtained can benefit from better performance (quality of the response of the electrical dipole relative to that expected in the LIF model of the artificial neuron, structural integration, etc.).

A description is provided below of the main steps of the method for manufacturing the single-component artificial neuron 40A shown in FIG. 4A.

First of all, a layer of $GaV_4S_8$ is deposited on a substrate wafer (a wafer of oxidized silicon for example). This layer of $GaV_4S_8$ constitutes the functional material of the single-component artificial neuron 40A. This deposition can be done typically by means of a technique of deposition such as Joule effect evaporation, magnetron sputtering (PVD), pulsed laser deposition (PLD), atomic layer deposition (ALD), chemical solution deposition (CSD), deposition by screen-printing, spin/dip coating deposition. Then, a metallic material constituting the input electrode 42A and the output electrode 43A of the neuron is deposited as explained above with reference to FIG. 3.

For the single-component artificial neuron 40B, first of all layer of metallic material constituting the output electrode 43B is deposited on a substrate wafer (a wafer of oxidized silicon for example), according to a technique of Joule effect evaporation or magnetron sputtering for example. Then, a layer of $GaV_4S_8$, constituting the functional material 41B of the single-component artificial neuron 40B, is deposited on said layer of metallic material 43B using one of the deposition techniques described above with reference to FIG. 4A. Finally, another layer of metallic material constituting the input electrode 42B of the neuron is deposited.

FIGS. 5A and 5B present two examples of a structure of a single-component artificial neuron according to a third particular embodiment of the invention (one-dimensional structure).

The single-component artificial neuron 50A shown in FIG. 5A is constituted by single electrical dipole, comprising a nanowire of Mott insulator 51A with the formula $(V_{1-x}Cr_x)_2O_3$, connected by two electrodes 52A and 53A.

The electrical dipole is supported by an insulator substrate 54A. It is therefore the electrical dipole 50A, as a single elementary electronic component, that behaves like an artificial neuron, the insulator substrate 54A fulfilling only the role of a support for the device of the invention. As described in greater detail below with reference to FIGS. 8 to 13, the single-component artificial neuron 50A thus obtained according to the invention is of a leaky integrate-and-fire type, i.e. it fulfills the three functions of the artificial neuron according to the LIF reference model.

In the exemplary embodiment illustrated here, the first electrode 53A is disposed in part beneath a first extremity of the Mott insulator nanowire 51A, the other part extending on the insulator substrate 54A. This electrode forms the input of the single-component artificial neuron 50A (denoted as INPUT in the figure). The second electrode 53A is disposed in part beneath the second extremity of the Mott insulator nanowire 51A, the other part extending on the insulator substrate 54A. This electrode forms the output of the single-component artificial neuron 50A (denoted as OUTPUT in the figure).

It is observed here that the set of electrodes 52A, 53A is disposed beneath the Mott insulator nanowire 51A, in other words that the Mott insulator nanowire 51A has not been deposited on the substrate 54A. This is of course one example of a particular structure. It is clear that many other structures of single-component artificial neurons can be envisaged without departing from the framework of the invention.

Below, a description is made of the main steps of the method for manufacturing the single-component artificial neuron 50A shown in FIG. 5A.

The method starts first of all with the deposition, on a substrate wafer (wafer of silicon for example) of a layer of metal material constituting the two electrodes, namely the input and output electrodes, of the neuron. This deposition can be done typically by means of one of the following techniques: Joule effect evaporation, magnetron sputtering (PVD), pulsed laser deposition (PLO), atomic layer deposition (ALD), chemical solution deposition (CSD), deposition by screen print, deposition by spin/dip coating. Then, the nanowire is positioned in such a way that it touches both the electrodes 52A and 53A at the same time, the nanowire having been preliminarily synthesized by means of a vapor-liquid-solid (VLS) method or template for example.

The example of FIG. 5B differs from that of FIG. 5A in that the artificial neuron is constituted not by a Mott insulator nanowire but by a Mott insulator nanotube 51B. The rest of the structure of this artificial neuron 50B is identical to the artificial neuron 50A. A conductive input electrode 52B is laid out beneath the nanotube 51B at one of its extremities and a conductive output electrode 53B is laid out beneath the nanotube 51B at the other of its extremities, the entire unit being disposed on an insulator substrate 54B.

The artificial neuron 50C represented in FIG. 5C is constituted by an electrical dipole comprising a Mott insulator nanowire 51C with the formula $V_{2-x}Cr_xO_3$, connected by two electrodes 52C and 53C.

In this third example, the electrical dipole is supported an insulator substrate 54C of a general L shape, having two appreciably parallel surfaces 56 and 57 on which are respectively laid out the layers of material forming the input electrode 52C and output electrode 53C of the artificial neuron. The two surfaces 56 and 57 are connected by a third surface 58 on which the nanowire 51C is laid out so that the extremity sections of this nanowire are connected to the input electrode 52C and output electrode 53C of the neuron.

First of all a layer of metallic material constituting the output electrode 53C of the neuron is deposited on the L-shaped substrate at the surface 57, for example by Joule effect evaporation. Then, the nanowire 51C is laid out so that one of its extremities is in contact with the output electrode 53C, so that a part of the circumferential surface of the nanowire extends along the surface 58 towards the surface 56, the nanowire having been preliminarily synthesized by means of a vapor-liquid-solid (VLS) method or template for example. Finally, another layer of metallic material is deposited at the free extremity of the nanowire and of the surface 56 to constitute the input electrode 52C of the neuron, for example by Joule effect evaporation.

In this particular embodiment, the Mott insulator nanowire or nanotube is deemed to have a one-dimensional (1D) structure. The neuron 50A, 50B or 50C according to the invention can therefore be equated with a one-dimensional (1D) artificial neuron.

In the artificial neuron as described above, in any one of its different embodiments (1D, 2D, 3D), the input and output electrodes can be made out of one of the following materials: a single element such as platinum (Pt), gold, (Au), silver (Ag), molybdenum (Mo), graphite (C), aluminum (Al), copper (Cu), doped silicon (Si)) or an alloy such as brass, steel, bronze for example or again a compound of transition metals such as TiN, TaN, $RuO_2$, $SrRuO_3$, $CuS_2$.

Figure 1:
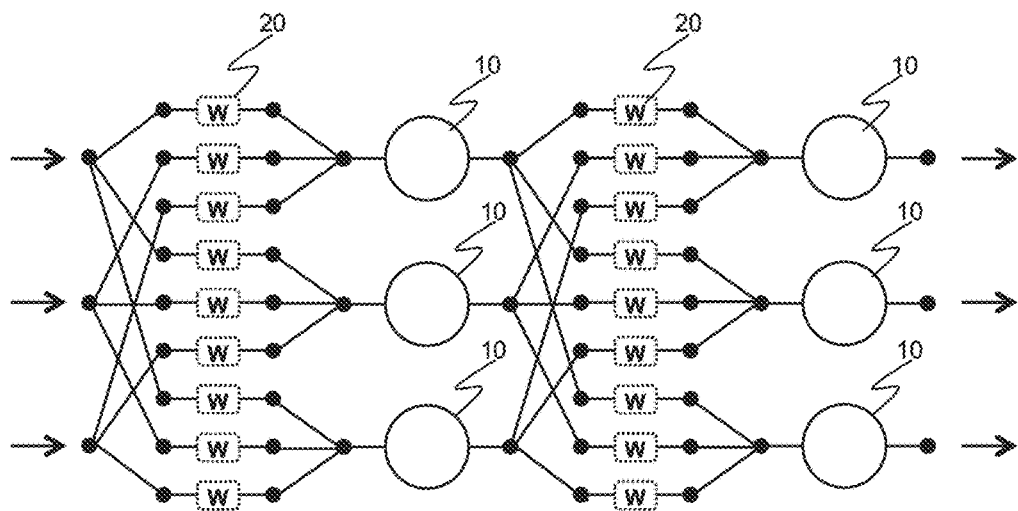
Figure 2:
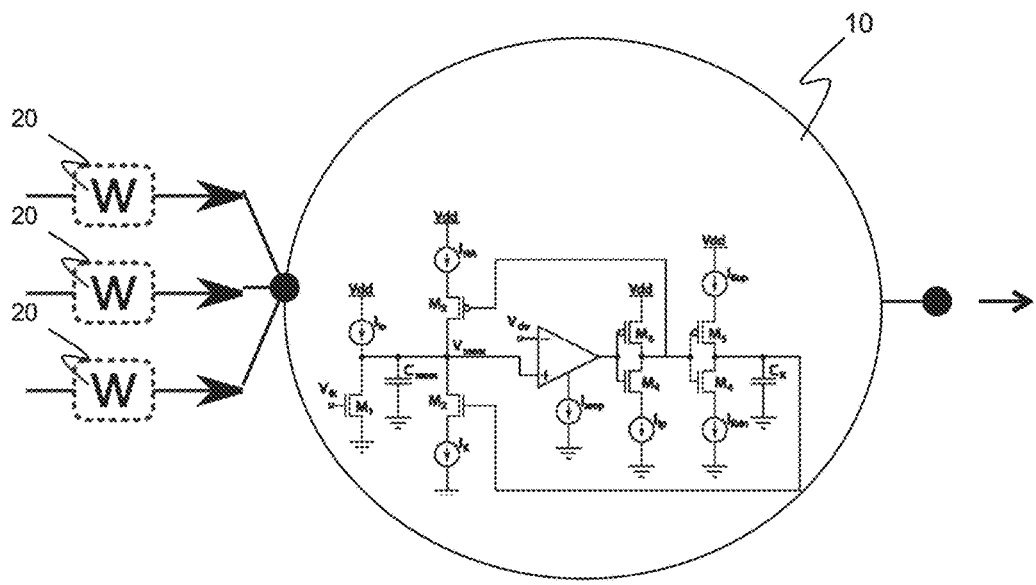

With a view to integration in a network of artificial neurons, each electrode of the single-component artificial neuron as described above in any one of its different embodiments (1D, 2D, 3D) is configured to be connected to one or more artificial synapses (not illustrated in the figure), such as for example artificial synapses w according to the neuromorphic architecture represented in FIG. 1 (where each artificial neuron is configured to be connected to a set of three synapses at input and three synapses at output).

The network of neurons according to the invention comprises a plurality of artificial neurons interconnected by artificial synapses. In one particular embodiment ("downgraded" mode), it is possible to envisage a network of artificial neurons, some of which are single-component artificial neurons according to the invention while the others are prior-art neurons. In another embodiment (the preferred embodiment), each artificial neuron of the network is a single-component artificial neuron as defined according to the invention.

FIG. 6 presents a network of three single-component artificial neurons $60_1$, $60_2$, $60_3$, according to one particular embodiment of the invention.

The single-component artificial neuron $60_1$ is formed by an electrical dipole comprising a thin layer $61_1$ made out of $GaV_4S_8$ material, the extremities of which are put into contact with a set of metal electrodes playing the input/output role for the neuron: the first extremity of said layer of $GaV_4S_8$ is in contact with the input electrode $62_1$ and the second extremity of said layer of $GaV_4S_8$ is in contact with the output electrode $63_1$.

The single-component artificial neuron $60_3$ is formed by an electrical dipole comprising a thin layer $61_3$ of $GaV_4S_8$ material, the extremities of which are put into contact with a set of metal electrodes playing the input/output role for the neuron: the first extremity of said layer of $GaV_4S_8$ is in contact with the input electrode $62_3$ and the second extremity of said layer of de $GaV_4S_8$ is in contact with the output electrode $63_3$.

Each single-component artificial neuron has been obtained by means of the manufacturing method described above with reference to FIG. 3 on an insulator substrate wafer 64 except that the input/output electrodes herein have a straight elongated shape and are placed beneath the thin layers of $GaV_4S_8$.

It is possible to envisage a situation where these single-component artificial neurons can be connected to artificial synapses (not shown in the figure) at the input (INPUT) and the output (OUTPUT) of each neuron so as to integrate an artificial neural network (such as the neuromorphic architecture shown in FIG. 1 where each neuron is connected to a set of three synapses at input and three synapses at output.

It is also possible to envisage the making of artificial neural networks having, on the one hand, a number of artificial neurons greater than three and comprising, on the other hand, artificial neurons either based on a piece of Mott insulator crystal or based on a thin layer of Mott insulator or based on a Mott insulator nanowire or nanotube.

FIGS. 7A, 7B, 7C, are timing diagrams showing the evolution of electrical signals illustrating the principle of operation of an artificial neuron of a leaky integrate-and-firing (LIF) type.

A LIF type artificial neuron receives a set of pulses S(t) weighted by the synaptic weight w (FIG. 7A). The artificial neuron then temporally integrates a function of this input signal; the quantity corresponding to the result of this integration by the artificial neuron is relaxed in the course of time (it is leaky) thus giving the signal v(t) (FIG. 7B). The signal v(t) is the equivalent of pre-synaptic membrane potential for a biological neuron. The artificial neuron triggers an output signal (Fire) when the signal v(t) reaches a given threshold. This output signal $S_{out}(t)$ (FIG. 7C) is a pulse, the shape of which is not explicitly defined in the LIF model.

The artificial neuron according to the LIF model therefore fulfills the following three functions: integration with leakage and firing. The experimental part described below shows that the Mott insulators have the properties required to behave like an artificial neuron according to the LIF model.

FIG. 8 is a drawing of an experimental assembly used for the application of electrical pulses and for highlighting the leaky integrate-and-fire (LIF) behavior of the single-component artificial neuron according to the invention.

It comprises an electrical pulse generator 83 series-mounted with an experimental device constituted by a conductance denoted "w" 84 playing the role of an artificial synapse itself series-mounted with a piece of crystal made out of a functional material 80 laid out between two metallic electrodes 81 and 82.

The goal was to test the response of the functional material 80 to the application of different series of electrical pulses emitted by the generator 83. The functional material 80 is herein a piece of $GaTa_4Se_3$ crystal which has been preliminarily synthesized, and then cleaved. This is one of the compounds belong to the family of Mott insulators $AM_4Q_8$, with A comprising at least one of the following elements: Ga, Ge, Zn; M comprising at least one of the following elements: V, Nb, Ta, Mo; and Q comprising at least one of the following elements: S, Se, Te.

The functional material 80 typically has the following dimensions: 300 μm long, 200 μm wide and 20 μm thick. The two metal electrodes 81 and 82 are formed for example by means of carbon lacquer.

The voltage across the terminals of the conductance "w" 84 (denoted as $V_w$) and the voltage across the terminals of the functional material 80 (denoted as V) are measured by means of an oscilloscope. The voltage of the pulses is defined according to the relationship $V_{total}=V+V_w$ and the resistance of the functional material (denoted as R) is computed according to Ohm's law: R=V/I, where I=w $V_w$.

To simplify the assembly in practice, the functional material 80 receives electrical signals only from one pulse generator 83. However, there is no impediment against having this functional material connected to several different pulse sources so as to mimic the great number of synaptic connections that can exist in an artificial neural network.

Figure 9:
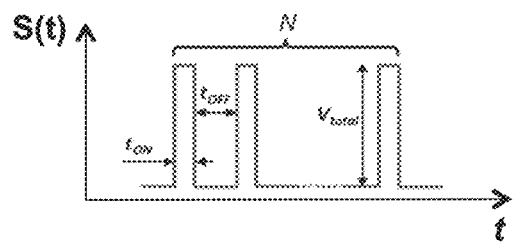
FIG. 9 is a schematic diagram of a series of electrical pulses that can be applied to the experimental device described with reference to FIG. 8.

FIG. 9 schematically illustrates the main characteristics of the series of electrical pulses emitted by the generator: the duration $t_{ON}$ of the electrical pulses, the duration $t_{OFF}$ that elapses between two successive pulses, the voltage $V_{total}$ of each pulse and the number N of pulses emitted in the series.

Figure 10:
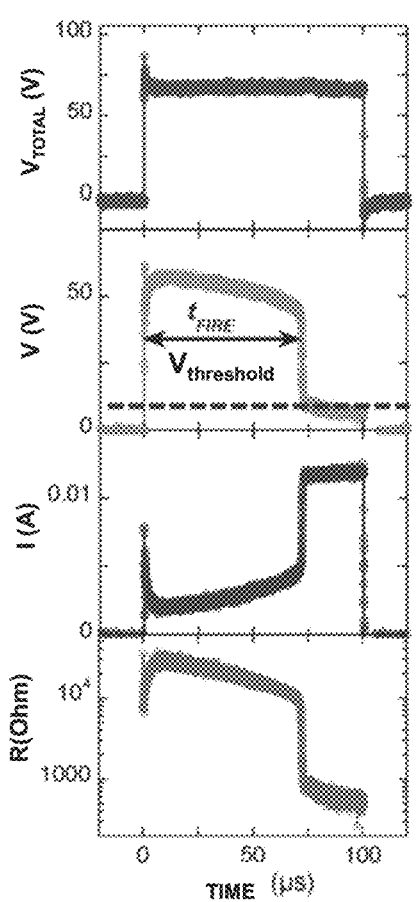
FIG. 10 is a set of experimental curves illustrating the phenomenon of volatile resistive transition induced by electrical pulses in the experimental device described in FIG. 8.

FIG. 10 shows the response of the functional material 80 when the circuit of FIG. 8 is subjected to a single electrical pulse having a lengthy duration (greater than 100 μs) and an amplitude of about 60 V. This response is herein characterized by the voltage V obtained across the terminals of the functional material 80, the current I flowing through it and its electrical resistance R.

At the end of a duration equal to about 70 μs ($t_{Fire}$=70 μs) after the start of the electrical pulse, a sudden drop in voltage V is observed at the terminals of the functional material 80, concomitant with a great increase in the current I which passes through it (see the characteristics I(t) and V(t) shown in FIG. 10), and therefore a great drop in resistance. These experimental curves highlight the physical phenomenon of resistive transition starting from an electrical field threshold. For the compound $GaTa_4Se_8$ the value of the threshold electrical field is approximately equal to 2.5 kV/cm which corresponds to a threshold voltage ($V_{threshold}$) equal to 10V in this example. The threshold value of the electrical field varies according to a power law with the energy of the gap of the Mott insulator compounds and can therefore be determined according to this relationship. It is therefore possible, by the choice of Mott insulator used, to optimize the value of this threshold field as a function of the desired characteristics.

FIG. 11 shows two experimental curves obtained for the functional material of the experimental assembly of FIG. 8 used to illustrate the fact that the resistance of the functional material returns to its initial state after the pulse and therefore that the resistive transition is volatile.

These experimental curves were obtained under the same conditions as those described in the FIGS. 10, 12A-C. The first graph shows the progress of the voltage $V_{total}$ applied to the functional material 80 and the second graph shows the progress of its resistance over time.

It can be seen that the resistance R of the functional material 80, after the resistive transition has been made (i.e. after a major drop in resistance due to the electrical pulse) gets relaxed until it reaches its state of equilibrium according to a decreasing exponential relationship. Refining the data shown in the insert A of FIG. 10 makes it possible to determine the characteristic relaxation time: $\tau \approx 610$ μs.

The application of the electrical pulses therefore enables the resistance of this material to be made to vary in a volatile manner between at least two distinct states of resistance. On the basis of this observation, the inventors have discovered that this property of the Mott insulators can be exploited to implement a single-component artificial neuron of the leaky integrate-and-fire (LIF) type.

Referring now to FIGS. 12A, 12B, 12C, we present a set of experimental curves obtained for the functional material 80 which illustrates the feasibility of the Leaky Integrate-and-Fire (LIF) functions of the single-component artificial neuron according to the invention.

FIG. 12A shows the response of the functional material 80 (the output signal is the intensity of the electrical current I), when the circuit of FIG. 8 is subjected to a series of six electrical pulses of a duration of $t_{ON}$=15 μs, separated from one another by a duration $t_{OFF}$=30 μs, and an amplitude of about 60 V (input voltage $V_{total}$).

After a series of six electrical pulses has been applied to the functional material 80, a sudden increase in the current I flowing through the functional material 80 is observed. The sudden appearance of this great increase in current I when the sixth electrical pulse is applied shows that a signal ("spike") has been triggered by the functional material 80.

This result is very important since it proves that the functional material carries out firstly the "firing" function and secondly an integration of a function of the input signal $V_{total}$. Indeed, each electrical pulse does not have any notable effect by itself since its duration is smaller than $t_{fire}$=70 μs (see FIG. 10), whereas several successive electrical pulses have the effect of inducing the "firing" phenomenon. This result therefore shows the performance of the "fire" and "integrate" functions i.e. two of the three functions of the LIF model.

The phenomenon of integration is also confirmed by a series of experiments carried out in keeping the duration $t_{OFF}$ between two successive pulses at a constant value and by causing the duration $t_{ON}$ of the electrical pulses to vary.

FIG. 12B shows the response of the functional material 80 (output signal I) when the circuit of FIG. 8 is subjected to a series of four electrical pulses with a duration of $t_{ON}$ of 20 μs, separated from one another by a duration $t_{OFF}$ of 30 μs, and with an amplitude of about 60 V (input signal $V_{total}$). Thus, FIG. 12B presents the same experiment as the one described for 12A but with an increased duration $t_{ON}$ of the electrical pulses applied to the functional material (the duration $t_{ON}$ goes from 15 to 20 μs).

It can be seen here that the number of pulses needed for the functional material 80 to trigger an output signal ("spike") diminishes when the duration $t_{ON}$ of the electrical pulses increases (the number of pulses needed goes from 6 to 4). Here again this makes it possible to show that the experimental device is capable of implementing the "Integrate" and "Fire" functions, i.e. two of the three functions of the LIF standard model.

FIG. 12C presents the same experiment as the one described in FIG. 12A but with a duration $t_{OFF}$ between two successive pulses that is higher (170 μs as against 30 μs in the preceding case). The result is very clear: the number of electrical pulses needed for the functional material 80 to trigger an output signal ("spike") has increased, passing from six to eight pulses. This proves that the signal integrated by the functional material relaxes over time, leading to a leaky form. This shows that the functional material is capable of implementing not only the integrate and firing functions but also the leaky function of the LIF standard model.

FIG. 13 presents the experimental dependency of the number of pulses needed to fire ($N_{Fire}$) with the duration $t_{on}$ (FIG. 13A) and the duration $t_{off}$ (FIG. 13B) obtained during experiments similar to those described in FIGS. 12A-C.

It can be seen that there is very close matching between the experimental points and the theoretical relationship:

$$N_{Fire} = -\frac{\tau}{t_{off}} \ln\left\{1 - \frac{\tau}{t_{on}} \times \left[1 - \exp\left(\frac{-t_{off}}{\tau}\right)\right] \times \left[1 - \exp\left(\frac{-t_{Fire}}{\tau}\right)\right]\right\} \qquad \text{equation (2)}$$

obtained by the mathematical development of the LIF model in the case of square-wave electrical pulses (the principle of which has been described above with reference to the prior art).

This very close matching is all the more remarkable as the theoretical dependency contains no adjustable parameter since the duration $t_{Fire}$ and the relaxation time $\tau$ have been set at experimental values it ($t_{Fire}$=70 μs and $\tau$=610 μs). This shows that the mathematical prediction of the LIF model (equation (2)) can be applied to the Mott-insulator-based single-component artificial neuron of the invention. This very high matching proves that there is a single integration threshold independent of the times $t_{on}$ and $t_{off}$, beyond which the artificial neuron according to the invention triggers the firing function.

All these experimental results prove therefore that the experimental device 80 based on Mott insulator $GaTa_4Se_8$ fulfills the three essential functions described by the LIF model ("Leaky Integrate-and-Fire"), i.e. integration with leakage and firing beyond a threshold. In addition, these results show that it is possible, for the artificial neurons according to the invention, to predict the number of electrical pulses needed to generate the "firing" function.

The single-component artificial neuron described here above in any one of its different embodiments (1D, 2D, 3D)

is based on the use of a Mott insulator with a formula $GaTa_4Se_8$ or $GaV_4S_8$. It is clear that any other material belonging to the family of Mott insulators can be envisaged as a functional material of a single-component artificial neuron without departing from the framework of the invention, such as for example:

compounds with the formula $AM_4Q_8$, with A comprising at least one of the following elements: Ga, Ge, Zn; M comprising at least one of the following elements: V, Nb, Ta, Mo and Q comprising at least one of the following elements: S, Se, Te;

compounds with the formula $(V_{1-x}M_x)_2O_3$, with $0 \leq x \leq 1$, M comprising at least one of the following elements: Ti, Cr, Fe, Al, or Ga;

compounds with the formula $NiS_{2-x}Se_x$, with $0 \leq x \leq 1$;

the compound with the formula $VO_2$;

organic Mott insulator compounds.

The invention claimed is:

1. An artificial neuron implementing functions of integration, leakage and firing, wherein the artificial neuron consists of:
    a single-component electrical dipole comprising a material belonging to the family of Mott insulators connected to first and second electrical electrodes, the artificial neuron being a Leaky Integrate-and-Fire (LIF) reference model artificial neuron consisting of the single-component electrical dipole.

2. The artificial neuron according to claim 1, wherein said Mott insulator material comprises:
    a compound of formula $AM_4Q_8$, with A comprising at least one of the following elements: Ga, Ge, Zn; M comprising at least one of the following elements: V, Nb, Ta, Mo: and Q comprising at least one of the following elements: S, Se; or
    an inorganic compound of formula $(V_{1-x}M_x)_2O_3$, with $0 \leq x \leq 1$, M comprising at least one of the following elements: Ti, Cr, Fe, Al, or Ga; or
    an inorganic compound of $NiS_{2-x}Se_x$, with $0 \leq x \leq 1$; or
    a compound of formula $VO_2$; or
    an organic Mott insulator compound.

3. The artificial neuron according to claim 1, wherein the first and second electrical electrodes are each constituted by an electrically conductive material comprising:
    one of the following elements: platinum (Pt), gold (Au), molybdenum (Mo), graphite (C), aluminum (Al), copper (Cu), doped silicon (Si); or
    one of the following alloys: brass (Cu—Zn), steel (Fe—C), bronze (Cu—Sn); or
    one of the following transition metal compounds: TiN, TaN, $RuO_2$, $SrRuO_3$, $CuS_2$.

4. The artificial neuron according to claim 1, wherein said Mott insulator material takes the form of:
    a thin layer; or
    a block of crystal; or
    a nanotube; or
    a nanowire.

5. A network of neurons comprising a plurality of artificial neurons, wherein at least one artificial neuron is according to claim 1.

6. A neuromorphic electronic circuit comprising a plurality of artificial neurons, wherein at least one artificial neuron is according to claim 1.

7. A method for manufacturing an artificial neuron implementing the functions of integration, leakage and firing, wherein the method comprises the following acts:
    obtaining a material belonging to the family of Mott insulators;
    obtaining a Leaky Integrate-and-Fire (LIF) reference model artificial neuron consisting of
        a single-component electrical dipole by deposition of a layer of conductive material:
        at a first extremity of said Mott insulator material to form a first electrical electrode, and
        at a second extremity of said Mott insulator material to form a second electrical electrode.

8. The method for manufacturing according to claim 7, wherein said act of obtaining a material is performed by cutting out a block of Mott insulator crystal, and wherein said act of depositing a layer of conductive material is performed as a function of said cut-out block of crystal.

9. The method for manufacturing according to claim 7, wherein said act of obtaining a material is performed by depositing, on a substrate wafer, a thin layer of a Mott insulator material,
    and wherein said act of depositing a layer of conductive material is performed as a function of said deposited thin layer.

10. The method for manufacturing according to claim 7, wherein said act of obtaining a material is performed by depositing, on a substrate wafer, a nanotube based on a Mott insulator material,
    and wherein said act of depositing a layer of conductive material is performed as a function of said deposited nanotube.

11. The method for manufacturing according to claim 7, wherein said act of obtaining a material is performed by depositing, on a substrate wafer, a nanowire based on a Mott insulator material,
    and wherein said act of depositing a layer of conductive material is performed as a function of said deposited nanowire.

* * * * *